United States Patent [19]

Genest

[11] Patent Number: 5,471,170
[45] Date of Patent: Nov. 28, 1995

[54] CURRENT-MODE AMPLIFICATION SYSTEM, AND CORRESPONDING OPERATIONAL AMPLIFIER, GAIN SECTION AND AMPLIFICATION ELEMENT

[75] Inventor: Pierre Genest, Butry Sur Oise, France

[73] Assignee: Alcatel Mobile Communication France, Paris, France

[21] Appl. No.: 312,037

[22] Filed: Sep. 26, 1994

[30] Foreign Application Priority Data

Sep. 27, 1993 [FR] France ................................. 93 11455

[51] Int. Cl.⁶ ...................................................... H03F 3/45
[52] U.S. Cl. ........................... 330/151; 330/260; 330/294; 330/306
[58] Field of Search ....................................... 330/151, 260, 330/294, 306; 327/557, 558, 559

[56] References Cited

U.S. PATENT DOCUMENTS 5,063,356  11/1991  Voorman ................................. 330/306

FOREIGN PATENT DOCUMENTS

| 0011446A1 | 5/1980 | European Pat. Off. . |
| 0275940A2 | 7/1988 | European Pat. Off. . |
| 0521215A1 | 1/1993 | European Pat. Off. . |
| 1556106   | 1/1969 | France . |
| WO9001831 | 2/1990 | WIPO . |

OTHER PUBLICATIONS

G. Nicollini et al, "A–78DB THD 100 Ohm Differential Driver for ISDN Applications", *IEEE International Solid State Circuits Conference*, vol. 34, Feb. 1991, pp. 278–329.

*Primary Examiner*—James B. Mullins
*Attorney, Agent, or Firm*—Sughrue, Mion, Zinn, Macpeak & Seas

[57] ABSTRACT

A current-mode amplification system including a first gain section and at least one second gain section chained together to form a chain of gain sections. The first gain section containing a first amplifier and a first low-pass filter. Each second gain section contains: a second amplifier having (1) a first input receiving the amplified and filtered output current from the preceding gain section in the chain, and (2) a second input receiving an input current of the amplification system, and delivering an amplified output current; an activator/deactivator for activating/deactivating the second input; and a second low-pass filter, the low-pass filter of each of the chained-together gain sections having a high cut-off frequency, the high cut-off frequencies of the various gain sections increasing from the input to the output of the amplification system.

15 Claims, 4 Drawing Sheets

CURRENT-MODE AMPLIFICATION SYSTEM, AND CORRESPONDING OPERATIONAL AMPLIFIER, GAIN SECTION AND AMPLIFICATION ELEMENT

FIELD OF THE INVENTION

The invention relates to performing analog processing on a signal. Such processing consists in particular in filtering and/or amplifying a signal, before it is converted into digital, and such processing can be performed only on a signal having high enough energy, because such processing generally consumes a large amount of energy. Unfortunately, in general, a signal to be processed is a low-energy signal, and the energy from the signal therefore has to be amplified before the signal is processed.

More precisely, the invention concerns an amplification system that can be implemented in the form of an operational amplifier and that makes it possible to amplify the energy from the signal so that it can be processed.

BACKGROUND OF THE INVENTION

In the state of the art close to the invention, two types of operational amplifier are known, namely the voltage-mode operational amplifier and the current-mode operational amplifier. Each of the two types of operational amplifier generally includes one or two gain sections. Another type of operational amplifier also exists, namely the combined voltage input and current negative feedback amplifier. Since that type of amplifier is not part of the state of the art close to the invention, it is not discussed below.

A current-mode operational amplifier has a wide passband and good accuracy for defining its gain, but unfortunately its gain cannot take a high value, because the gain of a current-mode gain section cannot be high.

In current mode, amplification proper is generally based on using a translinear mixer. Unfortunately, with a translinear mixer, if the two bias currents applied to the two input nodes are modulated by a common-mode current, the gain, which is a differential gain that is proportional to the ratio between the two bias currents, is also modulated. In other words, unwanted common mode gain might be produced.

A voltage-mode operational amplifier offers high gain, but suffers from numerous drawbacks. The value of the gain is difficult to control. The energy consumption can be low only at the expense of speed. In the same way, to obtain a wide passband, high current consumption is required. Finally, with filters, attenuation of fast signals makes it necessary to use high bias currents.

In order to obtain high gain while retaining most of the advantages offered by current mode, a known solution consists in chaining together a large number of current-mode gain sections, in general inside the same operational amplifier. In this way, the advantages of current mode, namely, in particular, good gain accuracy, are combined with high gain obtained by means of the chain structure.

However, that known solution suffers from a major drawback, namely the risk of phase instability. On passing through each of the gain sections in the amplification system, the signal is subjected to phase rotation.

The total phase rotation at the output of a current-mode amplifier is equal to the sum of the phase rotations imparted by the various sections. Since the chain structure of the amplifier comprises a large number of gain sections, the total output phase rotation is generally high. It is clear that, in most cases, the total phase rotation gives rise to instability in the feedback-mode operational amplifier.

In order to counter such instability, and to have a wide enough output phase margin, it has been proposed to create a dominant pole by working at low frequencies. But being constrained to work at low frequencies only, which results in a loss of passband in the amplified signal, makes that solution unattractive because it removes one of the main advantages of current mode, namely-having a wide passband.

Moreover, known state-of-the-art current-mode amplifiers suffer from other constraints, such as, in particular, low current offset and low noise, and high speed.

The current offset, which occurs in addition to the difference in current to be amplified, results from imperfect matching of transistors, and it can be attenuated only by choosing "large" transistors on which it is easier to obtain good geometrical accuracy. In the same way, the noise generated by the transistors, which is dependent on the W/L ratio of the component (e.g. MOS), is lower for large transistors than it is for small transistors. Unfortunately, large transistors suffer from the drawback of being slow (because their W/L ratio is low), i.e. they can only work at low frequencies, and only small transistors, which are of simple shape, can work at high frequencies.

Therefore, a compromise must be made between firstly speed and secondly current offset and noise.

OBJECTS AND SUMMARY OF THE INVENTION

An object of the invention is to mitigate the various drawbacks of the state of the art.

More precisely, an object of the invention is to provide a current-mode amplification system that has high gain and good accuracy in defining said gain.

Another object of the invention is to provide such an amplification system that offers phase stability (i.e. that has a wide enough phase margin at its output), and that has a wide passband.

Another object of the invention is to provide such an amplification system that offers low consumption while being fast, and therefore having a wide passband.

An additional object of the invention is to provide such an amplification system that is fast while having low noise and low current offset.

A further object of the invention is to provide such an amplification system that offers good common-mode rejection.

Another object of the invention is to provide such an amplification system that can be implemented with transistors that are either of the bipolar type or of the MOS type.

The invention achieves these objects and others that appear below by providing a current-mode amplification system including a first gain section and at least one second gain section chained together to form a chain of gain sections;

said first gain section comprising:
  amplification means receiving an input current which is the input current of said amplification system, and delivering an amplified output current; and
  low-pass filtering means receiving said amplified output current from said amplification means of said first gain section, and delivering an amplified and filtered output current;

said second gain section comprising:

amplification means having firstly a first input receiving the amplified and filtered output current from the preceding gain section in said chain, and secondly a second input receiving the input current of said amplification system, and delivering an amplified output current;

activation/deactivation means for activating/deactivating said second input; and low-pass filtering means receiving said amplified output current from said amplification means of said second gain section, and delivering an amplified and filtered output current;

said low-pass filtering means of each of said chained-together gain sections having a high cut-off frequency, the high cut-off frequencies of the various gain sections increasing from the input to the output of said amplification system.

The principle of the invention therefore consists in offsetting the high cut-off frequencies of the low-pass filtering means of the sections, and in re-injecting the input current of the operational amplifier into each of the second gain sections, via a second input on the amplification means of each of the second gain sections.

In other words, the gain sections are chained together in increasing order of speed (i.e. the order of the sections is a function of their capacity to work over an increasingly wide frequency band).

In this way, compensation is performed over a wide frequency band, the compensation being such that the phase rotation of the output current of the amplification means of a gain section is masked in the following gain section. Such compensation occurs when the current amplified by said following gain section, which current was previously constituted by the output current of the preceding gain section, becomes essentially constituted by the re-injected input current.

Since the phase rotation imparted by a section occurs for frequencies close to the high cut-off frequency of the low-pass filtering means of the section, the further the high cut-off frequencies are spaced apart from one another, the better the compensation will be. If the frequency band between two high cut-off frequencies is wide enough, it is possible to avoid a total phase rotation that might lead to a phase margin that is inacceptable (i.e. to instability at the output of the operational amplifier).

The chain structure enables high gain to be obtained.

Furthermore, by using current mode, it is possible to obtain good gain accuracy, and low consumption because the bias currents can be lower than with voltage mode.

In an advantageous embodiment of the invention, said activation/deactivation means for activating/deactivating the second input of the amplification means of said second gain section are of the high-pass type, and they have a low cut-off frequency, said second input being activated for frequencies that are higher than said low cut-off frequency, and being deactivated for the other frequencies, said low cut-off frequencies increasing from the input to the output of said amplification system.

In this way, the activation/deactivation means for activating/deactivating the second input of the amplification means of each of the second gain sections make it possible to inject a compensation current corresponding to a high frequency band of the input current of the amplification system. The high band is, as it were, filtered by the activation/deactivation means, and it is substantially equal to the frequency band that is complementary to the frequency band situated below the high cut-off frequency of the low-pass filtering means of the preceding gain section. In addition, the high band becomes narrower and narrower, corresponding to progressive filtering of the re-injected input current, and it makes it possible to compensate for the phase rotation imparted by each gain section.

Advantageously, the low cut-off frequency of the activation/deactivation means for activating/deactivating said second input of the second gain section is significantly lower than the high cut-off frequency of the low-pass filtering means of the preceding gain section.

In this way, after each amplification, compensation of the phase rotation effected in each gain section is optimized.

Advantageously, said amplification system includes an input section, placed upstream from said chain of gain sections and receiving said input current of the amplification system, said input section having a very low input impedance, said input section including adding means and delivering a current equal to the sum of the input current of the amplification system and of a DC bias current.

Advantageously, said amplification system includes an output section placed downstream from said chain of gain sections and receiving the current output by the last gain section, said output section having a very high output impedance.

In this way, the input section and the output section enable impedance matching to be performed respectively at the input and at the output of the operational amplifier.

In a preferred embodiment of the invention, said amplification means of a gain section comprise a first translinear multiplier and a second translinear multiplier that are symmetrical relative to each other and that are combined so that said first and second translinear multipliers have a common output which constitutes the output of said amplification means, each of said first and second translinear multipliers including two input transistors and at least one differential pair of output transistors.

In this way, without increasing consumption compared with a conventional structure having a single translinear multiplier, the gain of the section is doubled. In addition, with the structure having two symmetrical multipliers, the input transistors pass the same current, thereby making it possible to improve overall linearity and frequency response.

Preferably, said amplification means of said first gain section comprise:

a first bias stage including in particular at least two first current mirrors, each of which is constituted by two transistors, the first bias stage enabling the differential pair(s) of output transistors of said first translinear multiplier to be biased, and constituting a virtual ground for the input transistors of said first translinear multiplier;

an additional amplification stage including in particular at least two second current mirrors, each of which is constituted by two transistors, said second current mirrors receiving said input current of the amplification system and copying it so as to transmit it to said first current mirrors of said first bias stage, and two of said transistors constituting said second current mirrors being transformed into a differential pair of output transistors, when said additional amplification stage is activated;

activation means for activating said additional amplification stage as a function of the frequency of the input current of the amplification system, said additional amplification stage being activated at high frequencies, and deactivated at low frequencies;

a second bias stage, including in particular:

at least two third current mirrors, each of which is constituted by two transistors, the third current mirrors enabling the differential pair(s) of output transistors of said second translinear multiplier to be biassed, when said second bias stage is not deactivated; and at least two fourth current mirrors, each of which is constituted by two transistors, said fourth current mirrors receiving said input current of the amplification system and copying it so as to transmit it to said first current mirrors of said first bias stage when said second bias stage is not deactivated; and deactivation means for deactivating said second bias stage as a function of the frequency of the input current of the amplification system, said second bias stage being deactivated at high frequencies and activated at low frequencies.

In other words, two unit modules constituting the amplification means of the first gain section receive the input current of the amplification system, namely the additional amplification stage (which works at high frequencies), and the second bias stage (which works at low frequencies), the activation means and the deactivation means guaranteeing that only one of the two modules can be active at any one time.

Furthermore, regardless of which module is activated, that module copies the input current of the amplification system so as to transmit it to the first bias stage.

In this way, a bias stage is associated with each of the multipliers. The resulting bias for the first gain section may be achieved automatically (the term self-biasing is also used) since the section input current contains the bias current (generally referenced $I_o$) which is then the common-mode current.

With self-biasing, the input current of the first gain section contains a DC bias current, and the first gain section is such that the current sources of the two multipliers are self-biassed. The DC bias current is then a common-mode current and it is used by the current mirrors of each of the bias stages to bias the transistors in the differential pair of the corresponding multiplier: the first and second multipliers are self-biased respectively by the first bias stage and by the second bias stage.

Furthermore, the gain is set solely by the ratio of the transistors constituting the two bias stages. In other words, the bias stages impart excellent common-mode rejection to the amplification means. Therefore, if self-biasing is desired, it is only possible for the first gain section, since the following gain sections do not receive any common mode current.

In addition, the mirrors of the bias stages are not related to the differential component of the current since they appear to said component as a virtual ground. As a result, it is possible to use large transistors having limited offset and low noise to implement the bias stages.

Finally, by using current mirrors in the bias stages, it is possible to Guarantee that the same bias current is present in both multipliers of the section. This condition guarantees that there is no common-mode current at the output.

The assembly formed by the first and second bias stages, by the additional amplification stage, by the activation means, and by the deactivation means makes it possible to improve the speed of the amplification means of a gain section. The second bias stage is slow (it is intended to work at low frequencies only), and it can therefore be implemented with large transistors which enable the current offset to be reduced. In contrast, the additional amplification stage, which is cascaded to the second bias stage, is fast (it is intended to work at high frequencies only), and it must be implemented with small transistors.

Advantageously, said amplification means of said second gain section comprise:

a first bias stage including in particular at least two first current mirrors, each of which is constituted by two transistors, the first bias stage enabling the differential pair(s) of output transistors of said first translinear multiplier to be biassed, and constituting a virtual ground for the input transistors of said first translinear multiplier;

an additional amplification stage including at least two transistors, each of which is connected to a respective one of the transistors of said second current mirrors of said first gain section so as to constitute at least two fifth current mirrors, said fifth current mirrors receiving said input current of the amplification system and copying it so as to transmit it to said first current mirrors of said first bias stage of the second gain section, and said transistors of the additional amplification stage being transformed into a differential pair of output transistors, when said additional amplification stage is activated;

activation means for activating said additional amplification stage as a function of the frequency of the input current of the amplification system, said additional amplification stage being activated at high frequencies, and deactivated at low frequencies; and a second bias stage, including in particular:

at least two transistors, each of which is connected to a respective one of the transistors of said third current mirrors of said first gain section so as to constitute at least two sixth current mirrors enabling the differential pair(s) of output transistors of said second translinear multiplier of the second gain section to be biassed, when the second bias stage of the first gain section is not deactivated; and at least two transistors, each of which is connected to a respective one of the transistors of said fourth current mirrors of said first gain section so as to constitute at least two seventh current mirrors receiving said input current of the amplification system and copying it so as to transmit it to said first current mirrors of said first bias stage of the second gain section, when the second bias stage of the first gain section is not deactivated;

said first and second inputs of the amplification means of said second gain section being situated respectively at said second translinear multiplier and at said additional amplification stage, said activation means for activating the additional amplification stage of the second gain section constituting said activation/deactivation means for activating/deactivating the second input of the amplification means of said second gain section.

In this way, unlike the first gain section, which receives a single type of current to be amplified (namely the input current of the amplification system, which contains the DC bias current), the current being received at the second bias stage and at the additional amplification stage, the second gain sections receive two types of current to be amplified, namely:

firstly, at the second multiplier, the amplified and filtered output current of the preceding section ("low-frequency" current); and secondly, at the additional amplification stage (when it is activated), the input current of the amplification system ("high-frequency" current) making it possible to compensate for the phase rotation imparted by the preceding gain section.

It should be noted that the second gain sections are not self-biased, but rather they are biased via their second bias stages which are connected to the second bias stage of the first gain section.

Advantageously, said low-pass filtering means of each of said first and second gain sections comprise two pairs of passive elements, each pair being constituted by a resistor and by a capacitor.

Advantageously, the activation means for activating the additional amplification stage of the first gain section, the deactivation means for deactivating the second bias stage of the first gain section, and the activation means for activating the additional amplification stage of the second gain section are constituted by at least one capacitor that behaves like a short-circuit at high frequencies.

Advantageously, said transistors belong to the group comprising bipolar transistors and MOS transistors.

The invention is not limited to any one particular type of transistor.

In an advantageous embodiment of the invention, the transistors are of the MOS type, and, for each of the gain sections:

the transistors implemented in the first translinear multiplier and in the first bias stage are of the PMOS type; and the transistors implemented in the second translinear multiplier, in the additional amplification stage, and in the second bias stage are of the NMOS type.

In another advantageous embodiment of the invention, the transistors are of the bipolar type, and, for each of the gain sections:

the transistors implemented in the first translinear multiplier and in the first bias stage are of the PNP type; and the transistors implemented in the second translinear multiplier, in the additional amplification stage, and in the second bias stage are of the NPN type.

The invention also provides an operational amplifier incorporating a current-mode amplification system of the invention.

Finally, the invention provides advantageous embodiments for certain sub-assemblies of the amplification system.

In this way, the invention provides a gain section intended for implementation in a current-mode amplification system of the invention, said gain section including amplification means constituted in particular by two translinear multipliers that are symmetrical to each other and that are combined so that they have a common output constituting the output of said amplification means.

BRIEF DESCRIPTION OF THE DRAWINGS

Other characteristics and advantages of the invention will appear on reading the following description of a preferred embodiment of the invention, given by way of non-limiting example, and with reference to the accompanying drawings, in which.

MORE DETAILED DESCRIPTION

The invention concerns a current-mode amplification system. In accordance with the invention, the system may be integrated in an operational amplifier. For reasons of simplicity, only operational amplifiers are mentioned below. However, it is clear that the invention is not limited to this particular embodiment. More generally, it concerns an amplification system whose constituent parts may or may not be integrated in the same housing.

Figure 1:
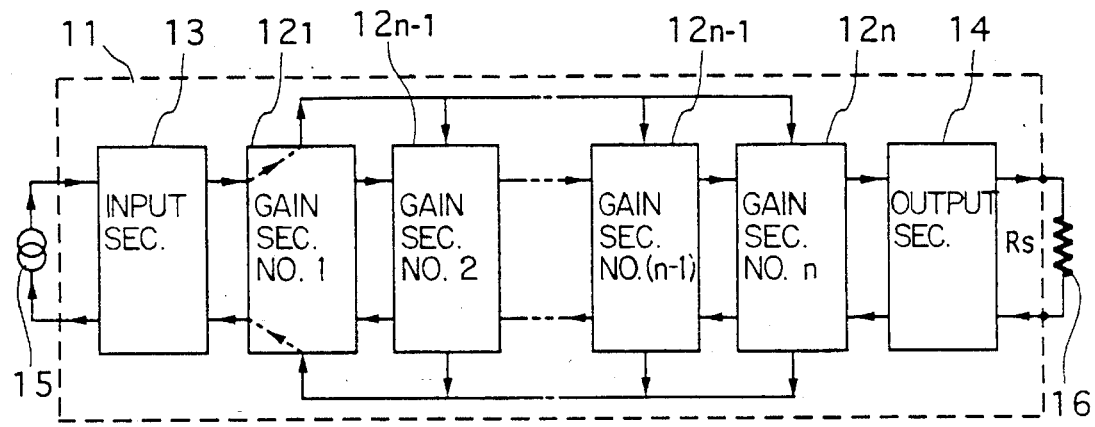
FIG. 1 is a simplified block diagram of a particular embodiment of a current-mode amplification system of the invention.

FIG. 1 is a simplified block diagram of an embodiment of such an amplifier of the invention.

In this particular embodiment of the invention, the current-mode operational amplifier 11 comprises a first gain section $12_1$, and n-1 second gain sections $12_2$ to $12_n$ chained together to form a chain of gain sections. The first gain section $12_1$ receives the operational amplifier input current 15. Each second gain section $12_2$ to $12_n$ receives both the output current of the preceding gain section, and also the operational amplifier input current 15.

The principle of the invention consists in forming a hierarchy of gain sections by chaining them together in increasing order of speed, and in re-injecting the amplifier input current 15 into each of the second gain sections $12_2$ to $12_n$ so as to compensate for the phase rotation imparted by the preceding gain section.

In this particular embodiment of the invention, the operational amplifier also includes an input section 13 and an output section 14 respectively performing input impedance matching and output impedance matching.

The input section 13 is placed upstream from the chain of gain sections $12_1$ to $12_n$, and it receives the amplifier input current. It has very low input impedance and it delivers current equal to the sum of the amplifier input current 15 and of a DC bias current $I_o$.

The output section 14 is placed downstream from the chain of gain sections $12_1$ to $12_n$, and it receives the output current of the last gain section $12_n$. The output section 14 has very high output impedance, and it delivers the output current 16 to the output load $R_s$.

Figure 2A:
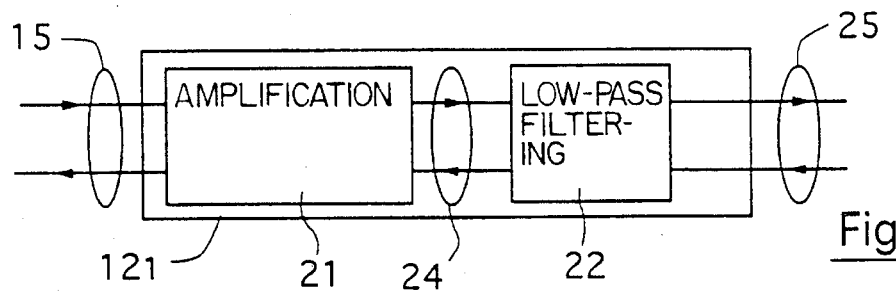
FIG. 2A is a simplified block diagram of the first gain section of an amplification system of the invention as shown in FIG. 1.

FIG. 2A is a simplified block diagram of the first gain section of the current-mode amplification system of the invention as shown in FIG. 1. The first gain section 121 comprises:

amplification means 21 receiving the input current 15 of the amplification system 11 and delivering an amplified output current 24; and low-pass filtering means 22 receiving the amplified output current 24 from the amplification means 21 of the first gain section 121, and delivering an amplified and filtered output current 25 (which is the output current of the first gain section).

Figure 2B:
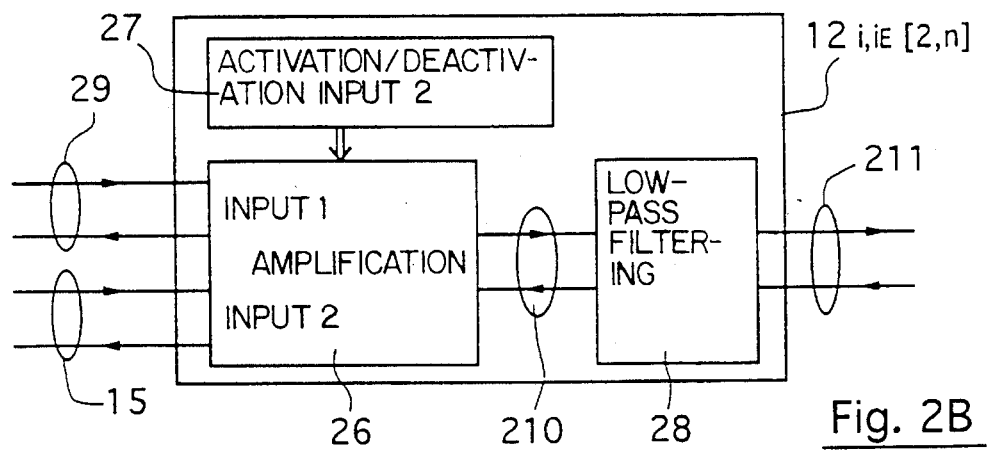
FIG. 2B is a simplified block diagram of a second gain section of an amplification system of the invention as shown in FIG. 1.

FIG. 2B is a simplified block diagram of one of the second gain sections 122 to 12n of the current-mode amplification system of the invention as shown in FIG. 1. Each of the second gain sections $12_2$ to $12_n$ comprises:

amplification means 26 having firstly a first input (referenced INPUT 1) receiving the amplified and filtered output current 29 from the preceding gain section in said chain, and secondly a second input I (referenced INPUT 2) receiving the input current 15 of the amplification system 11, and delivering an amplified output current 210;

activation/deactivation means 27 for activating/deactivating the second input INPUT 2; and low-pass filtering means 28 receiving the amplified output current 210 from said amplification means 26 of the second gain section, and delivering an amplified and filtered output current 211.

The low-pass filtering means 22, 28 of each of the chained-together gain sections $12_1$ to $12_n$ have a high cut-off frequency $(f_{h,i})$, where i is the number of the gain section in the chain. The low-pass filtering means create a dominant pole at the gain section to which they belong, the dominant pole brining the gain of the section to below 0 dB.

The gain sections $12_1$ to $12_n$ are placed in a hierarchy such that the high cut-off frequencies $f_{h,1}$ to $f_{h,n}$ are in increasing order. In other words, each gain section is faster than the preceding gain section going away from the input of the operational amplifier 11.

Figure 2C:
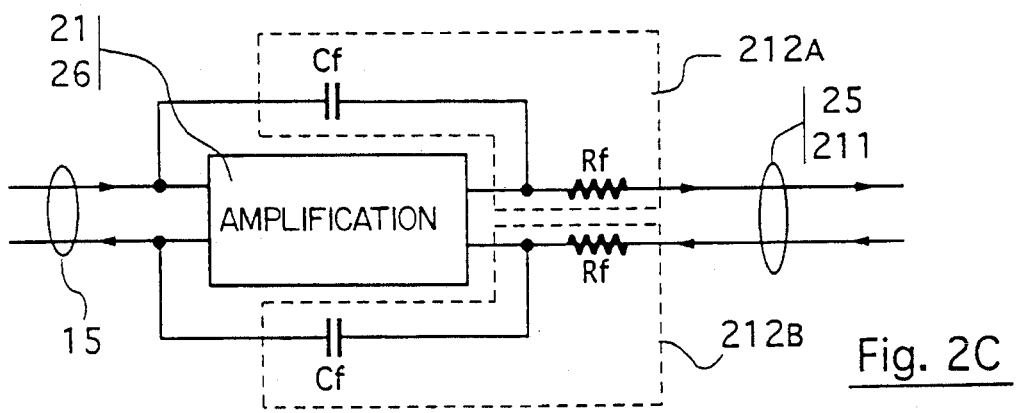
FIG. 2C is an electrical circuit diagram of an embodiment of the filtering means of the first and second gain sections as shown respectively in FIGS. 2A and 2B.

FIG. 2C is an electrical circuit diagram of an embodiment of the filtering means 22, 28 of the first gain section $12_1$ and of the second gain sections $12_2$ to $12_n$ as shown in FIGS. 2A and 2B respectively. For reasons of simplicity, the second current input (for a second gain section) is not shown. In this embodiment, the low-pass filtering means 22, 28 comprise two pairs $212_A$ and $212_B$ of passive elements, each pair being constituted by a resistor $R_f$ and by a capacitor $C_f$.

The activation/deactivation means 27 for activating/deactivating the second input INPUT 2 of the amplification means 26 of each second gain section $12_2$ to $12_n$ are of the high-pass type and have a low cut-off frequency $f_{b,i}$, where i is the number of the second gain section in the chain. The second input INPUT 2 of the amplification means of a second gain section $12_i$ is activated for frequencies higher than the low cut-off frequency $f_{b,i}$ of the second gain section, and deactivated for the other frequencies. The second gain sections $12_2$ to $12_n$ are chained together in increasing order of frequency $f_{b,2}$ to $f_{b,n}$.

For the remainder of the description given below, consideration is given to the advantageous particular case where the low cut-off frequency $f_{b,i+1}$ of the activation/deactivation means 27 of the second input INPUT 2 of a second gain section $12_{i+1}$ is significantly less than the high cut-off frequency $f_{h,i}$ of the low-pass filtering means 22, 28 of the preceding gain section $12_i$ (first gain section or second gain section).

Figure 3:
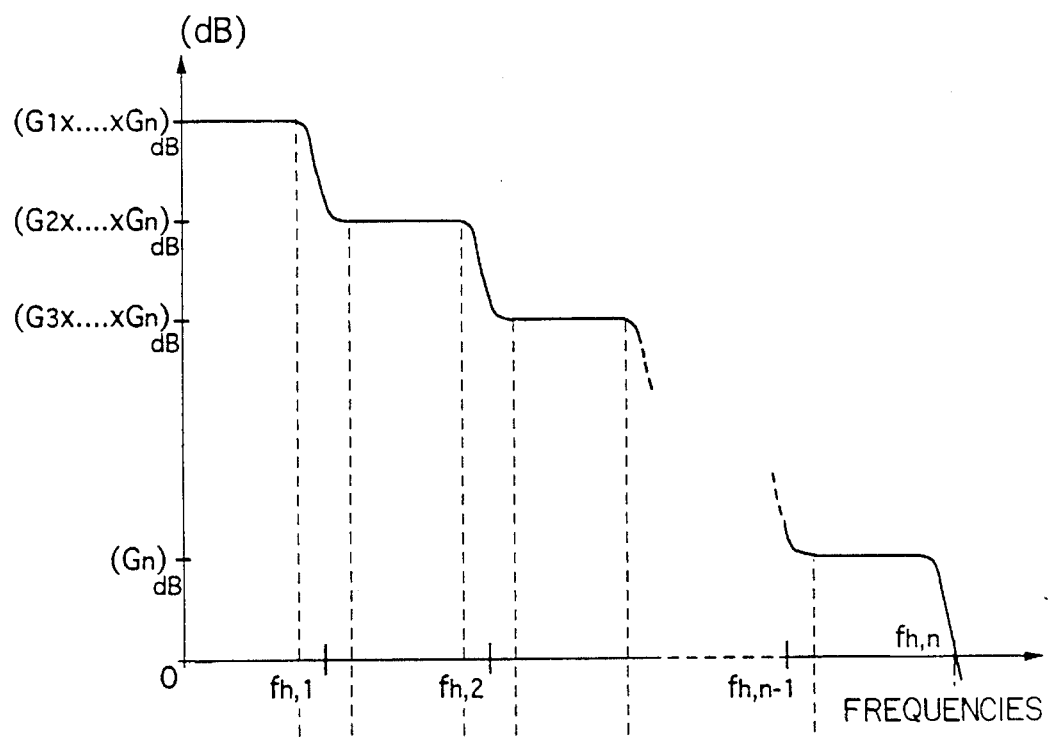
FIG. 3 shows a curve representing the variation in gain as a function of frequency for an amplification system of the invention as shown in FIG. 1.
Figure 4:
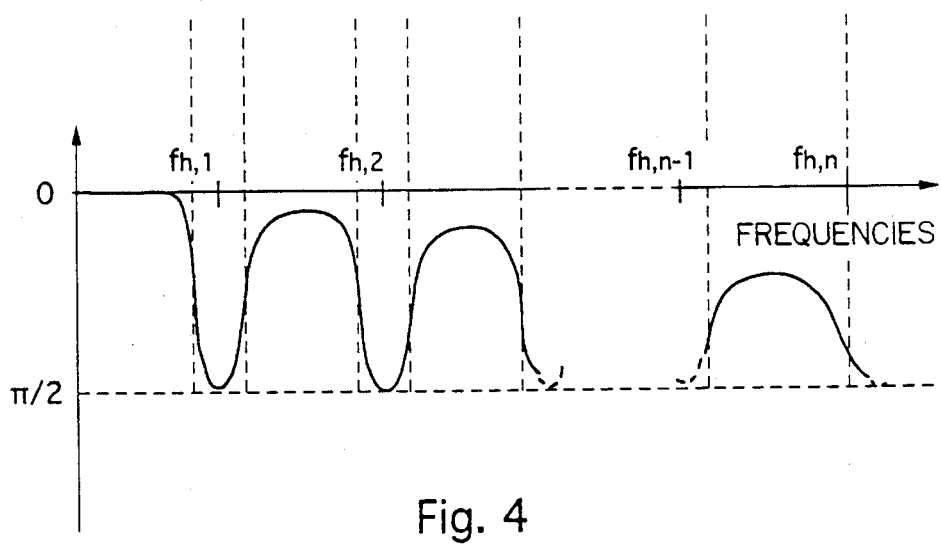
FIG. 4 shows a curve representing the variation in phase as a function of frequency for an amplification system of the invention as shown in FIG. 1.

The principle of the invention is described in detail below with reference to FIGS. 3 and 4, each of which show curves representing the variations respectively in gain and in phase as a function of frequency, for an operational amplifier of the invention as shown in FIG. 1.

At low frequencies, i.e. in the range 0 Hz to the high cut-off frequency $f_{h,1}$ of the low-pass filtering means of the first gain section $12_1$, the input current 15 of the operational amplifier 11 is amplified successively by each of the n chained-together gain sections $12_1$ to $12_n$. If $G_i$ is the gain of the $i^{th}$ gain section, the total gain in that frequency band $[0, f_{h,1}]$ is therefore substantially constant, and such that $G=G_1 \times G_2 \times G_3 \times \ldots \times G_n$.

In the vicinity of the high cut-off frequency $f_{h,i}$ of the low-pass filtering means of the first gain section $12_1$, the gain of the first gain section decreases to zero.

As a result, for frequencies higher than $f_{h,1}$ the first gain section has no influence on the total gain.

With respect to phase, the first gain section $12_1$ imparts a phase rotation of $\pi/2$ on the basis of a frequency that is substantially equal to the high cut-off frequency $f_{h,1}$ of its low-pass filtering means.

In accordance with the invention, the phase rotation is compensated, in the following second gain section $12_2$, by the input current 15 that is injected into the second input INPUT 2 of the amplification means 26 of the second gain section $12_2$. For frequencies that are higher than the high cut-off frequency $f_{h,1}$ of the low-pass filtering means of the first section (and therefore substantially equal to the low cut-off frequency of the activation/deactivation means for activating/deactivating the following second gain section $12_2$), the current amplified by the second gain section $12_2$ is essentially constituted by the injected current which has no phase rotation. The resulting section output current is wide-band because the amplified and filtered output current 25 of the first section and the current injected into the second section lie respectively in the frequency bands $[0, f_{h,1}]$ and $[f_{b,1}, \infty]$.

Using the same reasoning as above, it is easy to understand that, between the high cut-off frequency $f_{h,1}$ of the low-pass filtering means of the first gain section $12_1$ and the high cut-off frequency $f_{h,2}$ of the low-pass filtering means of the second gain section $12_2$, the total gain of the amplifier is: $G=G_2 \times G_3 \times \ldots \times G_n$. In the same way, the phase which undergoes a rotation of $\pi/2$ in the vicinity of $f_{h,2}$ is brought to an acceptable value by means of the compensation performed by injecting the filtered input current into the second input of the amplification means of the second gain section $12_2$.

The amplification means 21, 26 of one of the gain sections $12_1$ to $12_n$ are now described in detail with reference to FIGS. 5A, 5B, 6, and 7.

Figure 5A:
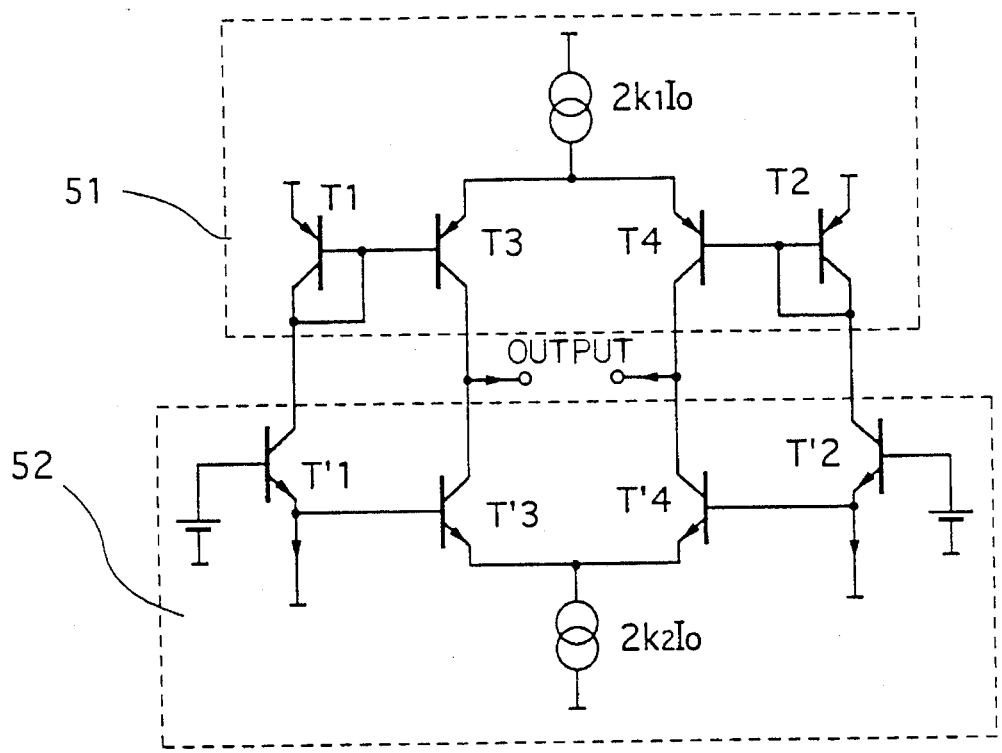
FIGS. 5A and 5B are electrical circuit diagrams, based respectively on bipolar transistors and on MOS transistors, of an association between two symmetrical translinear multipliers, it being possible to implement such an association in the amplification means of said first and second gain sections of an amplification system of the invention as shown in FIG. 1.

FIG. 5A is an electrical circuit diagram (based on bipolar transistors) of a combination of two symmetrical translinear multipliers, it being possible to implement this combination in the amplification means 21, 26 of a gain section $12_1$ to $12_n$ of the invention as shown in FIG. 1.

In the state of the art, a gain section generally includes a translinear multiplier which uses the exponential characteristic of the PN junction. Several types of translinear multiplier are known (they may be implemented using bipolar transistors or MOS transistors). In accordance with the invention, two types of translinear multiplier are combined, the two translinear multipliers being symmetrical to each other.

In this way, the amplification means of a gain section include a first translinear multiplier 51 and a second translinear multiplier 52 that are symmetrical to each other, and that are combined such that their outputs are common and constitute the output of the amplification means.

Each of the multipliers 51, 52 comprises two input transistors T1, T2 and T'1, T'2, and a differential pair of output transistors T3, T4 and T'3, T'4.

The multiplication factor of the first multiplier 51 is referenced $k_1$, and the multiplication factor of the second multiplier 52 is referenced $k_2$. By choosing $k_1 = k_2$, the gain is doubled compared with a single multiplier, while the same consumption is retained.

The bias current $I_o$ is either contained in the section input current, or it is conveyed independently thereof. It is only possible for the bias current to be contained in the input current for the first gain section because it receives the current output by the input stage and containing the bias current $I_o$, but it cancels the DC common mode component (and therefore the bias current).

In the embodiment based on bipolar transistors, the first multiplier 51 is implemented with PNP transistors, whereas the second multiplier is implemented with NPN transistors.

Figure 5B:
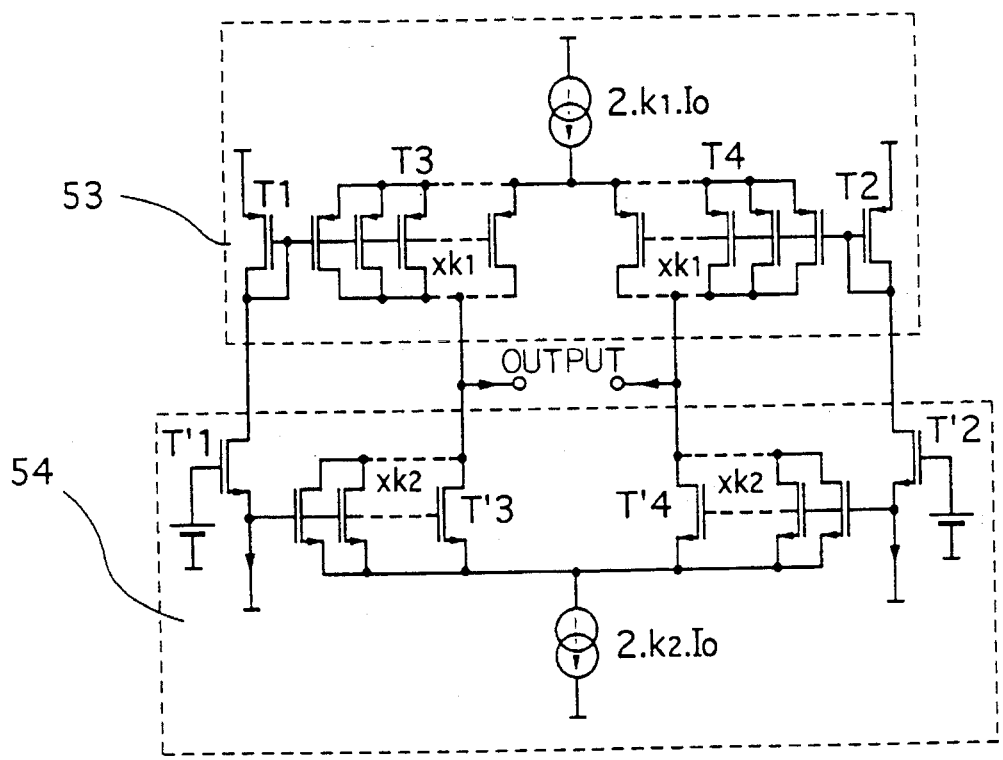

FIG. 5B corresponds to the MOS version of the electrical circuit diagram based on bipolar transistors shown in FIG. 5A. Going from bipolar to MOS involves changing the calculation mode because it means changing to a quadratic characteristic. However, apart from very small modifications (in particular a plurality of differential pairs T3, T4 and T'3, T'4 of output transistors instead of a single pair), the electrical circuit diagrams have structures that are very close to each other.

In the embodiment shown in FIG. 5B, the first multiplier 53 is implemented with PMOS transistors, and the second multiplier 54 is implemented with NMOS transistors.

Figure 6:
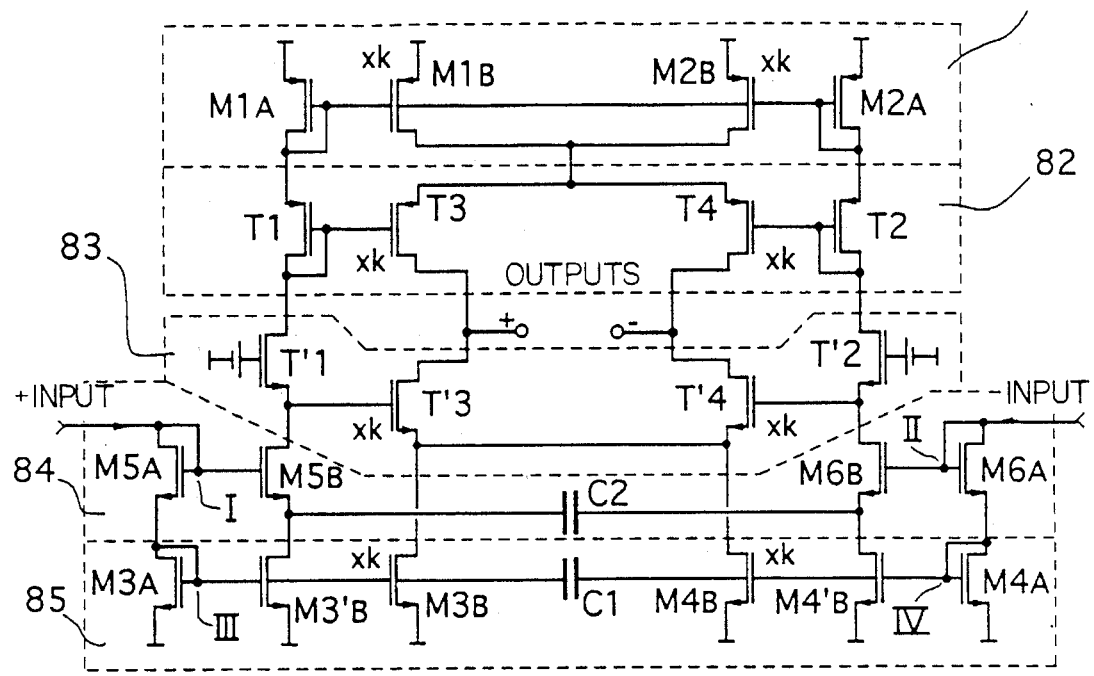
FIG. 6 is an electrical circuit diagram of the amplification means of the first gain section of the amplification system of FIG. 1.

FIG. 6 shows an electrical circuit diagram of an embodiment of the amplification means 21 of the first gain section 12₁ of the amplification system shown in FIG. 1. In this particular embodiment, the amplification means of the first gain section 12₁ comprise:

a first multiplier 82 co-operating with a first bias stage 81;

a second multiplier 83 co-operating with a second bias stage 85 and an additional amplification stage 84;

activation means C2 for activating the additional amplification stage 84; and deactivation means C1 for deactivating the second bias stage 85.

The first bias stage 81 comprises k first current mirrors (M1$_A$, M1$_B$) and (M2$_A$, M2$_B$), each of which is constituted by two transistors, enabling the k differential pairs of output transistors T3, T4 of the first translinear multiplier 82 to be biassed, and constituting a virtual ground for the input transistors T1, T2 of said first translinear multiplier (82).

The additional amplification stage 84 comprises two second current mirrors (M5$_A$, M5$_B$) and (M6$_A$, M6$_B$), each of which is constituted by two transistors. When the additional amplification stage 84 is activated, the second current mirrors receive (+INPUT and −INPUT) the input current of the amplification system and copy it so as to transmit it to the first current mirrors of the first bias stage. In addition, two of the transistors constituting the second current mirrors are then transformed into a differential pair of output transistors M5$_B$, M6$_B$.

The activation means C2 for activating the additional amplification stage 84 are such that the additional amplification stage is activated at high frequencies, and deactivated at low frequencies.

The second bias stage 85, includes in particular:

k third current mirrors (M3$_A$, M3$_B$), (M4$_A$, M4$_B$), each of which is constituted by two tertiary transistors, the third current mirrors enabling the k differential pairs of output transistors T3', T4' of the second translinear multiplier 83 to be biassed, when the second bias stage is not deactivated; and two fourth current mirrors (M3$_A$, M3$_B$'), (M4$_A$, M4$_B$'), each of which is constituted by two transistors, one of which is one of the tertiary transistors. When the second bias stage 85 is not deactivated, the fourth current mirrors receive (via +INPUT and −INPUT) the input current of the amplification system and copy it so as to transmit it to the first current mirrors of the first bias stage 81.

The deactivation means C1 for deactivating the second bias stage 85 are such that the second bias stage is deactivated at high frequencies and activated at low frequencies.

The activation means C2 and the deactivation means C1 are constituted by capacitors that behave like short-circuits at high frequencies. In this way, the second bias stage 85 constituted by slow transistors (which may therefore by large) is used (cascaded to the additional amplification stage 84) at low frequencies, where it enables current offset and noise to be limited. For higher frequencies, only the additional amplification stage 84, constituted by fast transistors, is used.

The transistors are of the following types:

PMOS for the first translinear multiplier 82 and the first bias stage 81; and

NMOS for the second translinear multiplier 83, the second bias stages 85 and the additional amplification stage 84.

For the first gain section 12₁, the components of the input current, which contain the bias current $I_o$, are injected directly into the current mirrors of the additional amplification stage 84, and, as a result of the cascaded structure, indirectly into the current mirrors of the second bias stage 85.

In this way, it is guaranteed that the same bias current $I_o$ is present in both of the multipliers 82, 83. This ensures that the amplification means of the first gain section inject no common mode output current. In addition, all of the bias transistors have the same drain-source voltage (or collector-emitter voltage), and this improves transistor matching.

It is clear that the bipolar version (not shown) corresponding to the MOS version shown in FIG. 6 may be implemented in the same manner as discussed above with respect to FIG. 5A and FIG. 5B.

Figure 7:
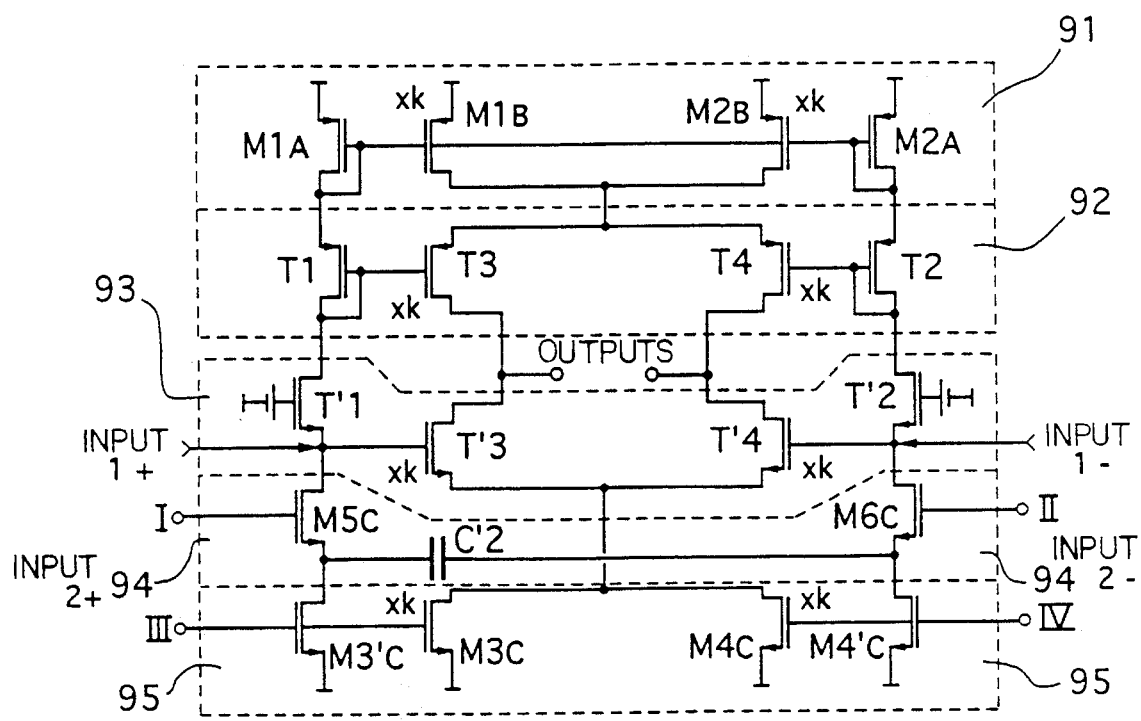
FIG. 7 is an electrical circuit diagram of the amplification means of one of the second gain sections of the amplification system in FIG. 1.

FIG. 7 is an electrical circuit diagram of an embodiment of the amplification means 26 of each of the second gain sections 12₂ to 12$_n$ of the amplification system shown in FIG. 1. In this particular embodiment, the amplification means of a second gain section 12₂ to 12$_n$ have a structure that is quite close to the structure of the amplification means of the first gain section 12₁, and they comprise:

a first multiplier 92 co-operating with a first bias stage 91;

a second multiplier 93 co-operating with a second bias stage 95 and an additional amplification stage 94; and activation means C'2 for activating the additional amplification stage 94.

The first bias stage 91 is identical to the first bias stage 81 of the amplification means of the first gain section.

The additional amplification stage 94 comprises two transistors M5$_C$, M6$_C$, each of which is connected at points referenced I and II in FIGS. 6 and 7) to a respective one of the transistors M5$_A$, M6$_A$ of the second current mirrors (M5$_A$, M5$_B$), (M6$_A$, M6$_B$) of the first gain section so as to constitute two fifth current mirrors (M5$_A$, M5$_C$), (M6$_A$, M6$_C$). When said additional amplification stage 94 is activated, the fifth current mirrors receive the input current 15 of the amplification system and copy it so as to transmit it to the first current mirrors of the first bias stage 91 of the second gain section. Furthermore, the transistors of the additional amplification stage 94 are then transformed into a differential pair of output transistors (M5$_C$, M6$_C$).

The activation means C2' for activating the additional amplification stage 94 are such that the additional amplification stage 94 is activated at high frequencies, and deactivated at low frequencies.

The second bias stage 95, includes in particular:

k pairs of transistors M3$_C$, M4$_C$, each of which is connected (at points referenced III and IV in FIGS. 6 and 7) to a respective one of the transistors M3$_A$, M4$_A$ of the third current mirrors (M3$_A$, M3$_B$), (M4$_A$, M4$_B$) of the first gain section so as to constitute two sixth current mirrors (M3$_A$, M3$_C$), (M4$_A$, M4$_C$); when the second bias stage 85 of the first gain section is not deactivated, the sixth current mirrors enable the differential pair(s) of output transistors T3', T4' of the second translinear multiplier 93 of the second gain section to be biassed; and two transistors M3$_C$', M4$_C$', each of which is connected to a respective one of the transistors M3$_A$, M4$_A$ of the fourth current mirrors (M3$_A$, M3$_B$'), (M4$_A$, M4$_B$') of the first gain section so as to constitute two seventh current mirrors; when the second bias stage 85 of the first gain section is not deactivated, the seventh current mirrors receive the input current of the amplification system and copy it so as to transmit it to the first current mirrors of the first bias stage of the second gain section.

The first input (+INPUT1, −INPUT1) and the second input (+INPUT2, −INPUT2) of the amplification means of the second gain section are situated respectively at the second translinear multiplier 93 and at the additional amplification stage 94. The activation means C2' for activating the additional amplification stage 94 of the second gain section constitute the activation/deactivation means for activating/deactivating the second input of the amplification means of the second gain section.

As above, the second bias stage 95 is slower than the additional amplification stage 94.

For the second gain sections 12$_2$ to 12$_n$ (i.e. the gain sections other than the first gain section 12$_1$), the components of output current of the preceding gain section do not contain any bias current I$_o$ because of the good common-mode rejection of the first gain section 12$_1$.

It is clear that the bipolar version (not shown), corresponding to the MOS version shown in FIG. 7, may be implemented in the same manner as discussed above with regard to FIGS. 5A, 5B and FIG. 6.

I claim:

1. A current-mode amplification system, including a first gain section and at least one second gain section chained together to form a chain of gain sections;

said first gain section comprising:

amplification means receiving an input current which is the input current of said amplification system, and delivering an amplified output current; and low-pass filtering means receiving said amplified output current from said amplification means of said first gain section, and delivering an amplified and filtered output current;

said second gain section comprising:

amplification means having firstly a first input receiving the amplified and filtered output current from the preceding gain section in said chain, and secondly a second input receiving the input current of said amplification system, and delivering an amplified output current;

activation/deactivation means for activating/deactivating said second input; and low-pass filtering means receiving said amplified output current from said amplification means of said second gain section, and delivering an amplified and filtered output current;

and wherein said low-pass filtering means of each of said chained-together gain sections has a high cut-off frequency, the high cut-off frequencies of the various gain sections increasing from the input to the output of said amplification system.

2. An amplification system according to claim 1, wherein said activation/deactivation means for activating/deactivating the second input of the amplification means of said second gain section are of the high-pass type, and they have a low cut-off frequency, said second input being activated for frequencies that are higher than said low cut-off frequency, and being deactivated for the other frequencies, said low cut-off frequencies increasing from the input to the output of said amplification system.

3. An amplification system according to claim 2, wherein the low cut-off frequency of the activation/deactivation means for activating/deactivating said second input of the second gain section is significantly lower than the high cut-off frequency of the low-pass filtering means of the preceding gain section.

4. An amplification system according to claim 1, including an input section, placed upstream from said chain of gain sections and receiving said input current of the amplification system, said input section having a very low input impedance;

and wherein said input section includes adding means and delivers a current equal to the sum of the input current of the amplification system and of a DC bias current.

5. An amplification system according to claim 1, including an output section placed downstream from said chain of gain sections and receiving the current output by the last gain section, said output section having a very high output impedance.

6. An amplification system according to claim 1, wherein said amplification means of each of said first and second gain sections comprise a first translinear multiplier and a second translinear multiplier that are symmetrical relative to each other and that are combined so that said first and second translinear multipliers have a common output which constitutes the output of said amplification means;

and wherein each of said first and second translinear multipliers include two input transistors and at least one differential pair of output transistors.

7. An amplification system according to claim 6, wherein said amplification means of said first gain section comprise:

a first bias stage including at least two first current mirrors, each of which is constituted by two transistors, the first bias stage enabling the differential pair of output transistors of said first translinear multiplier to be biassed, and constituting a virtual ground for the input transistors of said first translinear multiplier;

an additional amplification stage including at least two second current mirrors, each of which is constituted by two transistors, said second current mirrors receiving said input current of the amplification system and copying it so as to transmit it to said first current mirrors of said first bias stage, and two of said transistors constituting said second current mirrors being transformed into a differential pair of output transistors, when said additional amplification stage is activated;

activation means for activating said additional amplification stage as a function of the frequency of the input current of the amplification system, said additional amplification stage being activated at high frequencies, and deactivated at low frequencies;

a second bias stage, including:

at least two third current mirrors, each of which is constituted by two tertiary transistors, the third current mirrors enabling the differential pair of output transistors of said second translinear multiplier to be biassed, when said second bias stage is not deactivated; and at least two fourth current mirrors, each of which is constituted by two transistors one of which is one of said tertiary transistors, said fourth current mirrors receiving said input current of the amplification system and copying it so as to transmit it to said first current mirrors of said first bias stage when said second bias stage is not deactivated; and deactivation means for deactivating said second bias stage as a function of the frequency of the input current of the amplification system, said second bias stage being deactivated at high frequencies and activated at low frequencies.

8. An amplification system according to claim 7, wherein said amplification means of said second gain section comprise:

a first bias stage including in particular at least two first current mirrors, each of which is constituted by two transistors, the first bias stage enabling the differential pair of output transistors of said first translinear multiplier to be biassed, and constituting a virtual ground for the input transistors of said first translinear multiplier;

an additional amplification stage including at least two transistors, each of which is connected to a respective one of the transistors of said second current mirrors of said first gain section so as to constitute at least two fifth current mirrors, said fifth current mirrors receiving said input current of the amplification system and copying it so as to transmit it to said first current mirrors of said first bias stage of the second gain section, and said transistors of the additional amplification stage being transformed into a differential pair of output transistors, when said additional amplification stage is activated;

activation means for activating said additional amplification stage as a function of the frequency of the input current of the amplification system, said additional amplification stage being activated at high frequencies, and deactivated at low frequencies; and a second bias stage, including in particular:

at least two transistors, each of which is connected to a respective one of the transistors of said third current mirrors of said first gain section so as to constitute at least two sixth current mirrors enabling the differential pair of output transistors of said second translinear multiplier of the second gain section to be biassed, when the second bias stage of the first gain section is not deactivated; and at least two transistors, each of which is connected to a respective one of the transistors of said fourth current mirrors of said first gain section so as to constitute at least two seventh current mirrors receiving said input current of the amplification system and copying it so as to transmit it to said first current mirrors of said first bias stage of the second gain section, when the second bias stage of the first gain section is not deactivated;

and wherein said first and second inputs of the amplification means of said second gain section are situated respectively at said second translinear multiplier and at said additional amplification stage, said activation means for activating the additional amplification stage of the second gain section constituting said activation/ deactivation means for activating/deactivating the second input of the amplification means of said second gain section.

9. An amplification system according to claim 8, wherein the activation means for activating the additional amplification stage of the first gain section, the deactivation means for deactivating the second bias stage of the first gain section, and the activation means for activating the additional amplification stage of the second gain section are constituted by at least one capacitor.

10. An amplification system according to claim 7, wherein, for each of said first and second gain sections:

the transistors implemented in the first translinear multiplier and in the first bias stage are of the PMOS type, and the transistors implemented in the second translinear multiplier, in the additional amplification stage, and in the second bias stage are of the NMOS type.

11. An amplification system according to claim 7, wherein said transistors are bipolar transistors and wherein, for each of the gain sections:

the transistors implemented in the first translinear multiplier and in the first bias stage are of the PNP type; and the transistors implemented in the second translinear multiplier, in the additional amplification stage, and in the second bias stage are of the NPN type.

12. An amplification system according to claim 6, wherein said transistors are either bipolar transistors or MOS transistors.

13. An amplification system according to claim 1, wherein said low-pass filtering means of each of said first and second gain sections comprise two pairs of passive elements, each pair being constituted by a resistor and by a capacitor.

14. A gain section which is adapted for implementation in a current-mode amplification system according to claim 1, and each said amplification means having: two translinear multipliers that are symmetrical to each other and that are combined so that they have a common output: and an output formed by said common output.

15. An amplification element of the type constructed around said translinear multipliers, and adapted for implementation in the gain section according to claim 14, said element including at least one bias stage comprising two current mirrors enabling at least differential pair of output transistors of said translinear multipliers to be biassed, and constituting a virtual ground for input transistors of said translinear multipliers.

* * * * *